(12) United States Patent
Hwang et al.

(10) Patent No.: US 8,018,774 B2
(45) Date of Patent: Sep. 13, 2011

(54) METHOD OF OPERATING NONVOLATILE MEMORY DEVICE AND MEMORY SYSTEM

(75) Inventors: Jung-Seok Hwang, Mungyeong-si (KR); Sangwon Hwang, Suwon-si (KR); Jong-Nam Baek, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 177 days.

(21) Appl. No.: 12/558,630

(22) Filed: Sep. 14, 2009

(65) Prior Publication Data

US 2010/0103742 A1 Apr. 29, 2010

(30) Foreign Application Priority Data

Oct. 24, 2008 (KR) .................. 10-2008-0104727

(51) Int. Cl.
*G11C 16/06* (2006.01)

(52) U.S. Cl. ......... 365/185.22; 365/185.29; 365/185.18; 365/185.24

(58) Field of Classification Search ............. 365/185.22, 365/185.18, 185.29, 185.24, 185.07, 185.03
See application file for complete search history.

(56) References Cited

U.S. PATENT DOCUMENTS

| 6,381,178 | B1 | 4/2002 | Kodama |
| 7,835,190 | B2 * | 11/2010 | Sarin et al. ............... 365/185.22 |

FOREIGN PATENT DOCUMENTS

| JP | 2000252447 A | 9/2000 |
| KR | 1020000062623 A | 10/2000 |
| KR | 1020070110634 A | 11/2007 |
| KR | 100811274 B1 | 2/2008 |

* cited by examiner

*Primary Examiner* — David Lam
(74) *Attorney, Agent, or Firm* — Volentine & Whitt, PLLC

(57) ABSTRACT

A method of operating a nonvolatile memory device includes; performing a verification operation on memory cells while controlling a verification voltage until the memory cells are verification-passed, controlling a level of a bias voltage to be applied to the memory cells according to a level of the verification voltage when the memory cells are verification-passed, and applying the bias voltage to the memory cells.

10 Claims, 10 Drawing Sheets

US 8,018,774 B2

METHOD OF OPERATING NONVOLATILE MEMORY DEVICE AND MEMORY SYSTEM

CROSS-REFERENCE TO RELATED APPLICATION

This U.S. non-provisional patent application claims priority under 35 U.S.C. §119 to Korean Patent Application No. 2008-104727 filed on Oct. 24, 2008, the subject matter of which is hereby incorporated by reference.

BACKGROUND

The present disclosure relates to semiconductor memory devices. More particularly, the disclosure relates to methods of operating nonvolatile memory devices and a memory system including same.

Semiconductor memory devices may be classified in two general types; volatile memory devices and nonvolatile memory devices. Volatile memory devices lose stored data in the absence of applied power, and include SRAM, DRAM and SDRAM. Nonvolatile memory devices retain stored data in the absence of applied power and include ROM, PROM, EPROM, EEPROM, flash memory, PRAM, MRAM, RRAM, and FRAM. Flash memory devices may be further classified as NOR-type or NAND-type.

SUMMARY

Embodiments of the invention provide a method of operating a nonvolatile memory device comprising; performing a verification operation on memory cells while controlling a verification voltage until the memory cells are verification-passed, controlling a level of a bias voltage to be applied to the memory cells according to a level of the verification voltage when the memory cells are verification-passed, and applying the bias voltage to the memory cells.

The bias voltage may be an erase voltage and the verification voltage may be an erase verification voltage.

Embodiments of the invention provide a method of erasing programmed memory cells in a nonvolatile memory device, the method comprising; applying an erase voltage having an erase beginning voltage to the memory cells, comparing threshold voltages for the memory cells to a verification voltage, determining whether the memory cells are verification-passed in relation to the verification voltage, upon determining that the memory cells are verification-passed, determining whether the verification voltage is less than a defined first limit voltage, upon determining that the verification voltage is not less than a defined first limit voltage, adjusting the erase voltage to be equal to a voltage at which the memory cells were last determined to be erase-fail, and thereafter, applying the adjusted erase voltage to the memory cells.

Embodiments of the invention provide a method of operating a nonvolatile memory device applying an erase voltage to memory cells during an erase operation, the method comprising; applying the erase voltage to the memory cells, counting a number of unerased memory cells following application of the erase voltage, determining a current erase voltage adjustment increment corresponding to the number of unerased memory cells, comparing at least one of the number of unerased memory cells and the erase voltage adjustment increment to a limit, and upon obtaining a number of unerased memory cells or an erase voltage adjustment increment below the limit, constructing an erase table identifying the unerased memory cells and a corresponding erase voltage adjustment increment.

Embodiments of the invention provide a memory system comprising; a nonvolatile memory device, and a controller configured to control the nonvolatile memory device. The nonvolatile memory device is configured to perform a verification operation while controlling a verification voltage until memory cells are verification-passed, control a level of a bias voltage to be applied to the memory cells according to a level of the verification voltage of when the memory cells are verification-passed, and apply the controlled bias voltage to the memory cells.

BRIEF DESCRIPTION OF THE DRAWINGS

The attached drawings illustrate certain embodiments of the present invention and together with the written description serve to explain principles of the present invention. In the figures.

DESCRIPTION OF EMBODIMENTS

Embodiments of the invention will now be described in some additional detail with reference to the accompanying drawings. The present invention may, however, be embodied in different forms and should not be construed as being limited to only the illustrated embodiments. Rather, the embodiments are presented as teaching examples. Throughout the drawings and written description, like reference numbers and label are used to denote like or similar elements.

Figure 1:
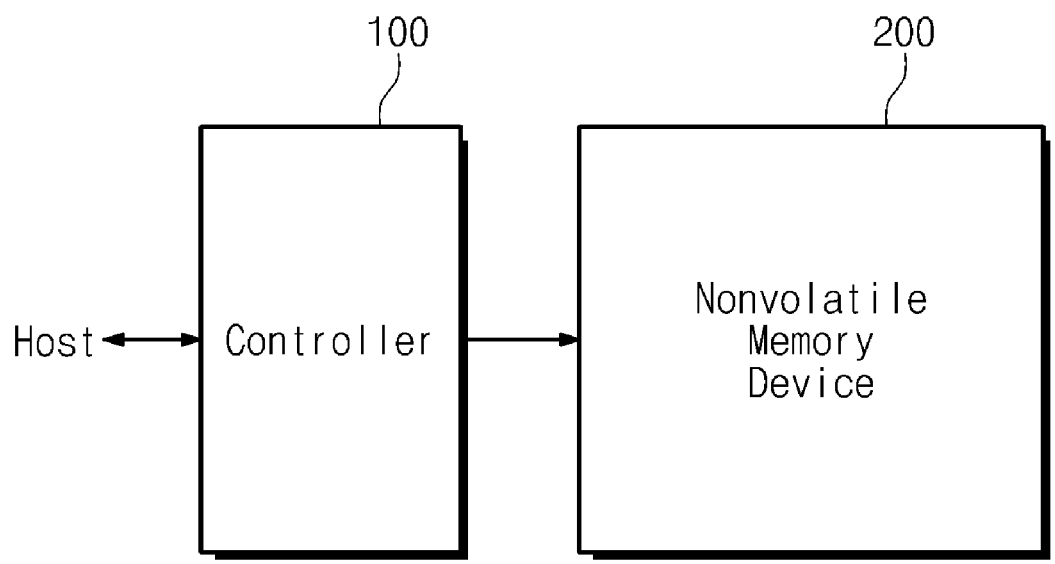
FIG. 1 is a general block diagram of a memory system according to an embodiment of the invention.

Figure (FIG. 1 is a general block diagram of a memory system 10 according to an embodiment of the invention. Referring to FIG. 1, the memory system 10 comprises a nonvolatile memory device 200 and a controller 100.

The controller 100 is connected between a host and the nonvolatile memory device 200. The controller 100 transfers "read data" retrieved from the nonvolatile memory device 200 during a read operation in response to a command from the host. The controller 100 also transfers "write data" received from the host to the nonvolatile memory device 200 for storage.

The controller 100 may be implemented in a number of conventional semiconductor devices and related circuitry. It may include a number of constituent components such as a RAM, a processing unit, a host interface, a memory interface, etc. The RAM may be used as an operating memory for the processing unit. The processing unit may control operations within the controller 100. The host interface will enable at least one data communications protocol defining data exchanges between the host and the controller 100. For example, the controller 100 may communicate with the host using one or more conventionally understood protocols, such as USB, MMC, PCI-E, advanced technology attachment (ATA), serial-ATA, parallel-ATA, SCSI, ESDI and integrated drive electronics (IDE). The memory interface of the controller 100 facilitates a data interface with the nonvolatile memory device 200.

In some embodiments of the invention, the controller 100 will further include an error detection and/or correction block of conventional design and operation. The error detection and correction block may be used to detect error(s) in read data retrieved from the nonvolatile memory device 200 and/or correct the error(s).

The nonvolatile memory device 200 generally includes an array of memory cells capable of storing N bit data, where N is a positive integer. Read and write (or program) operations indicated by commands from the host communicated via the controller 100 cause data to be transferred to and from the memory cell array. The nonvolatile memory device 200 also includes a read/write circuit enabling the writing of write data in the memory cell array, and the retrieval of read data from the memory cell array. The read/write circuit operates in conjunction with an address decoder decoding an externally provided address and control logic controlling the overall operation of the nonvolatile memory device 200. One possible embodiment of the nonvolatile memory device 200 will be further described in relation to FIGS. 2 and 3.

In certain embodiments of the invention, the controller 100 and nonvolatile memory device 200 may be integrated into a single semiconductor device. For example, the controller 100 and nonvolatile memory device 200 may be integrated into memory card. That is, the controller 100 and nonvolatile memory device 200 may be integrated in a PC card (PCM-CIA), a compact flash card (CF), a smart media card (SM/SMC), a memory stick, a multimedia card (MMC, RS-MMC, MMCmicro), a SD card (SD, mini SD, micro SD), a universal flash memory device (UFS) or the like.

Alternately, the controller 100 and nonvolatile memory device 200 may be integrated in a solid state disk/driver (SSD) device. If the memory system 10 is to be used as a solid state disk/driver (SSD), the overall operating speed of the memory system 10 in relation to the host may be greatly improved by this embodiment.

Indeed, memory system 10 may find application in many different types of hosts including a Personal Digital Assistant (PDA), a portable computer, a web tablet, a wireless phone, a mobile phone, a digital music player or devices that can send and receive data in a wireless environment.

One particular embodiment of the invention will now be described in the context of a flash memory device. However, those skilled in the art will recognize that the teachings and principles set forth in this working embodiment are applicable to a host of possible devices and systems well beyond the exemplary flash memory device. Further, any specific type of nonvolatile memory device, regardless of enabling technology, is contemplated for use with embodiments of the invention.

Figure 2:
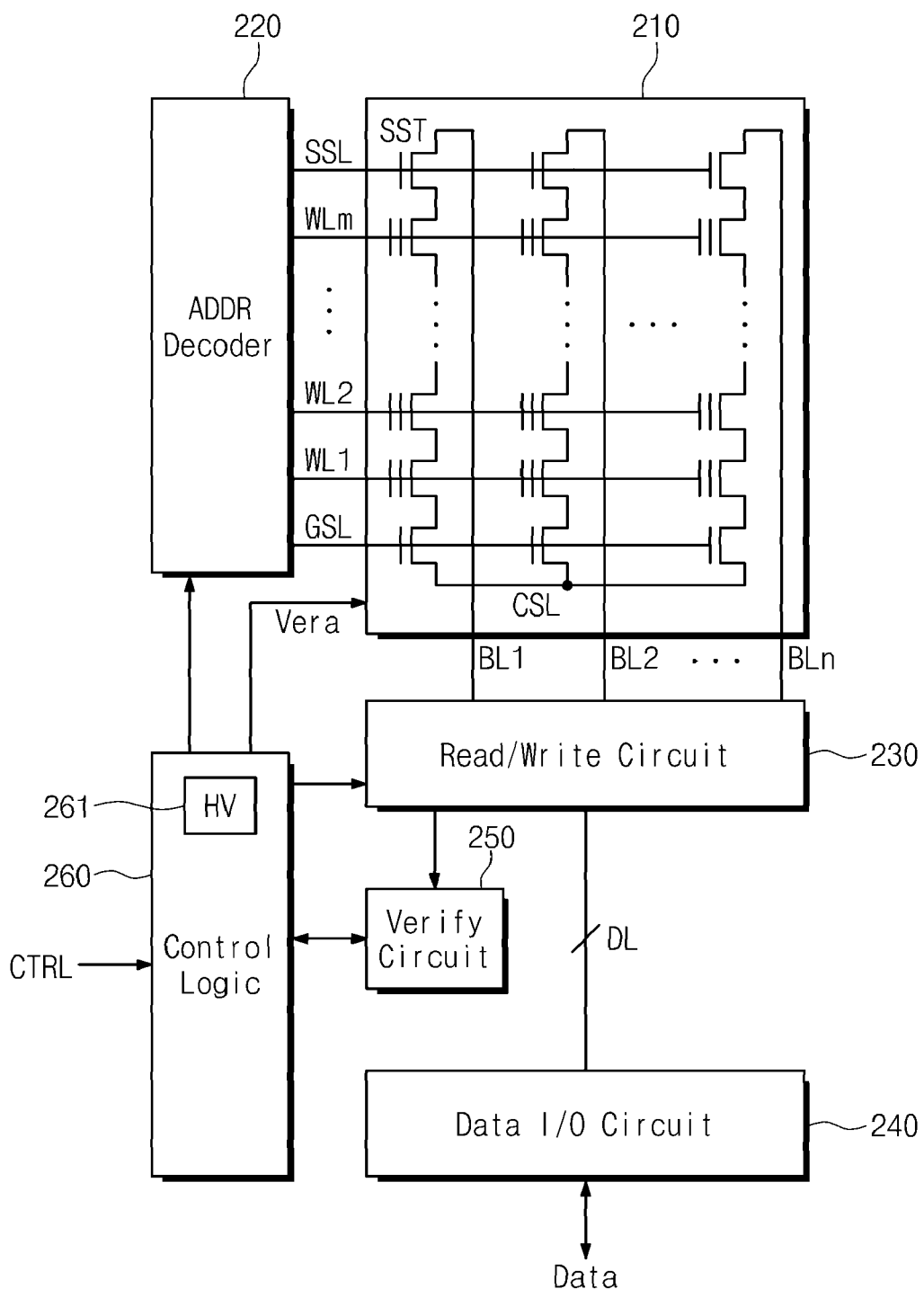
FIG. 2 is a block diagram further illustrating the nonvolatile memory device of FIG. 1.

FIG. 2 is a block diagram further illustrating the nonvolatile memory device 200 of FIG. 1. Referring to FIG. 2, the nonvolatile memory device 200 comprises a memory cell array 210, an address decoder 220, a read/write circuit 230, a data input/output circuit 240, a verification circuit 250 and a control logic 260.

The memory cell array 210 is connected to the address decoder 220 through word lines (WL1~WLm), a string select line (SSL) and a ground select line (GSL). The memory cell array 210 is connected to the read/write circuit 230 through bit lines (BL1~BLn). The memory cell array 210 includes a plurality of memory blocks. One memory block is depicted in the memory cell array of FIG. 2 for a brief description.

The memory cell array 210 includes a plurality of memory cells (MC). The memory cells (MC) store at least one bit. That is, the memory cells (MC) may be a single level cell (SLC) storing one bit or may be a multi-level cell (MLC) storing a plurality of bits.

String select transistors (SST) are connected between the memory cells (MC) serially connected to each other and the bit lines (BL1~BLn). Ground select transistors (GST) are connected between the memory cells (MC) serially connected to each other and a common source line (CSL). The string select transistors (SST) are connected to the string select line (SSL). The ground select transistors are connected to the ground select line (GSL). The memory cells (MC) are connected to the word lines (WL1~WLm) corresponding to the memory cells (MC).

The address decoder 220 is connected to the memory cell array 210, the read/write circuit 230 and the control logic 260. The address decoder 220 operates in response to a control of the control logic 260. The address decoder 220 receives an address (ADDR) from the external device and decodes the address (ADDR). As an illustration, the address decoder 220 receives an address (ADDR) from the controller 100 of FIG. 1.

The address decoder 220 decodes a row address among the received addresses (ADDR) to select the word lines (WL1~WLm). The address decoder 220 decodes a column address among the received addresses (ADDR) to transmit the decoded column address to the read/write circuit 230. As an illustration, the address decoder 220 may include conventionally understood constituent elements such as an address buffer, a row decoder and a column decoder.

The read/write circuit 230 is connected to the memory cell array 210, the address decoder 220, the data input/output circuit 240, the verification circuit 250 and the control logic 260. The read/write circuit 230 operates under the control of the control logic 260. The read/write circuit 230 exchanges data with the data input/output circuit 230 through a data line (DL). The read/write circuit 230 selects the bit lines (BL1~BLn) in response to the decoded row address transmitted from the address decoder 220. With this configuration, the read/write circuit 230 is able to perform read/write operations in relation to the memory cells (MC).

The read/write circuit 230 receives write data to be written to the memory cell array from the data input/output circuit 240. The read/write circuit 230 transfers read data retrieved from the memory cell array 210 to the data input/output circuit 240. When a copy-back operation is performed, the read data retrieved from the memory cell array 210 is not transferred to the data input/output circuit 240, but rather is transferred to the memory cell array 210.

When an erase operation is performed, the read/write circuit 230 performs a portion of the erase operation. The read/write circuit 230 sets the bit lines (BL1~BLn) to bit line voltages and latches the voltages of the bit lines (BL1~BLn) after a predetermined time. The latched bit line voltages are transmitted to the verification circuit 250.

In one embodiment for example, the read/write circuit 230 includes well known constituent elements such as a page buffer, a column select circuit, a write driver, a detection amplifier and a column select circuit.

The data input/output circuit 240 is connected to the read/write circuit 230 and to control logic 260. The data input/output circuit 240 operates under the control of the control logic 260. The data input/output circuit 240 facilitates the transfer of data to external circuitry. In one embodiment, the data input/output circuit 240 transfers data with the controller 100 of FIG. 1.

The data input/output circuit 240 transfers externally provided data to the read/write circuit 230, and data retrieved from the read/write circuit 230 to external circuitry. In one embodiment, the data input/output circuit 240 includes well known constituent elements such as a data buffer.

The verification circuit 250 is connected to the read/write circuit 230 and control logic 260. The verification circuit 250 operates under the control of the control logic 260. The verification circuit 250 receives the latched bit line voltage from the read/write circuit 230. The verification circuit 250 determines a pass/fail state for the memory cells (MC) using the latched bit line voltage. This pass/fail determination result is then transmitted to the control logic 260.

The verification circuit 250 determines the pass/fail state according to whether threshold voltages of the memory cell (MC) are higher or lower than a verification voltage (Vver). In one embodiment that assumes a program operation, the verification circuit 250 determines that the memory cells (MC) "pass" when the threshold voltages of the memory cells (MC) are higher than the verification voltage (Vver). The verification circuit 250 further determines that the memory cells (MC) pass when levels of all the latched bit line voltages are equal to the set bit line voltage. That is, if the memory cells (MC) are OFF-cells when the verification voltage (Vver) is applied to the word lines (WL1~WLm), the verification circuit 250 determines that the memory cells (MC) pass.

For another example that assumes an erase operation, the verification circuit 250 determines that the memory cells (MC) pass when threshold voltages of the memory cells (MC) are lower than the verification voltage (Vver). The verification circuit 250 further determines that the memory cells (MC) pass when levels of all the latched bit line voltages are lower than the set bit line voltage. That is, if the memory cells (MC) are ON-cells when the verification voltage (Vver) is applied to the word lines (WL1~WLm), the verification circuit 250 determines that the memory cells (MC) pass.

The control logic 260 is connected to the address decoder 220, the read/write circuit 230, the data input/output circuit 240 and the verification circuit 250. The control logic 260 controls the overall operation of the nonvolatile memory device 200. The control logic 260 performs a verification operation while controlling the verification voltage until the memory cells (MC) are verified as "pass" (hereafter, "verification-passed"), controls the level of a bias voltage to be applied to the memory cells (MC) according to a level of the verification voltage of when the memory cells (MC) are verification-passed and applies the bias voltage to the memory cells (MC).

The control logic 260 includes a high voltage generator 261. The high voltage generator 261 generates high voltages such as a program voltage (Vpgm), a pass voltage (Vpass) and an erase voltage (Vera) by boosting a power supply voltage (Vcc). In one embodiment, the high voltage generator 261 includes well known constituent elements such as a charge pump.

Hereinafter, certain embodiments of the invention will be further described using an example that assumes that the control logic 260 controls both the verification voltage (Vver) and erase voltage (Vera), and controls the application of the verification voltage (Vver) and erase voltage (Vera). However, these control voltages are merely examples of a broader class of control voltages similarly applicable within nonvolatile memory devices. Thus, the invention is not limited to only the control and application of a verification voltage (Vver) and erase voltage (Vera). Rather, it will be understood that embodiments of the invention may be applied to operations performed by nonvolatile memory devices wherein a bias voltage is gradually applied to memory cells, while controlling the level of the bias voltage being applied to the memory cells. However, since the working embodiment of the invention will be described in the context of an erase operation, it will be understood that the verification circuit 250 will determine whether the memory cells are in a pass state in accordance with whether the threshold voltages of the memory cells are lower than the verification voltage (Vver).

Figure 3:
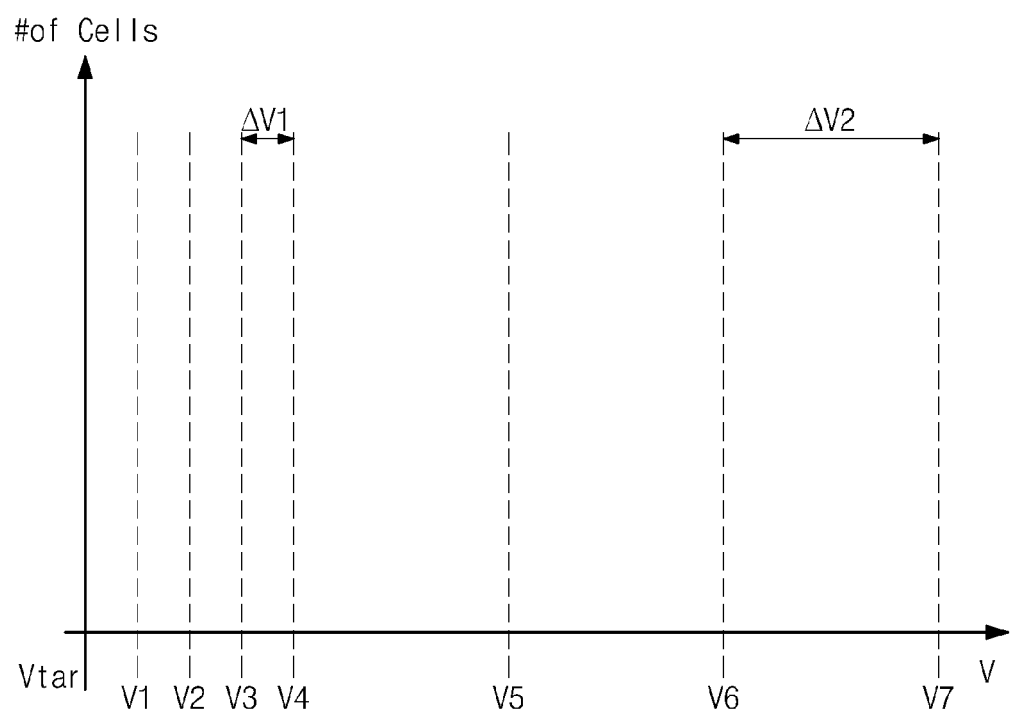
FIG. 3 is a conceptual diagram illustrating one control method for controlling the level of a verification voltage within a nonvolatile memory according to an embodiment of the invention.

FIG. 3 is a conceptual diagram further illustrating a control method whereby the control logic 260 controls a verification voltage and an erase voltage (Vera) within the embodiment illustrated in FIGS. 1 and 2. In FIG. 3, the horizontal axis represents voltage. For convenience, the vertical axis of FIG. 3 represents a number of the memory cells (MC). A target voltage (Vtar) is defined as a reference voltage used to determine whether the memory cells (MC) are in an "erase-pass" state. That is, following an erase operation, a determination is made as to whether the memory cells (MC) have threshold voltages lower than the target voltage (Vtar). If yes, then the memory cells (MC) are determined to be erase-pass.

The control logic 260 increases the verification voltage (Vver) from a level of the target voltage (Vtar). The control logic 260 increases the verification voltage (Vver) from the level of the target voltage (Vtar) to a predetermined voltage (V4) by a first voltage increment ($\Delta V1$). The control logic 260 increases the verification voltage (Vver) from the predetermined voltage (V4) by a second voltage increment ($\Delta V2$). In one embodiment of the invention, the difference between the target voltage (Vtar) and the predetermined voltage (V4) is identical to the second voltage ($\Delta V2$). The control logic 260 performs a verification operation while increasing the verification voltage (Vver) until the memory cells (MC) are verification-passed.

If the level of the verification voltage (Vver) when the memory cells (MC) are verification-passed is higher than the predetermined voltage (V4), the control logic 260 adjusts the erase voltage to a level lower than the level when the memory cells (MC) are verification-passed. If the level of the verification voltage (Vver) when the memory cells (MC) are verification-passed is lower than the predetermined voltage (V4), the control logic 260 adjusts the erase voltage to the level of the verification voltage (Vver) when the memory cells (MC) are verification-passed. As described below in some additional detail, the control logic 260 adjusts the erase voltage (Vera) according to the level of the verification voltage (Vver) when the memory cells (MC) are verification-passed.

Figure 4:
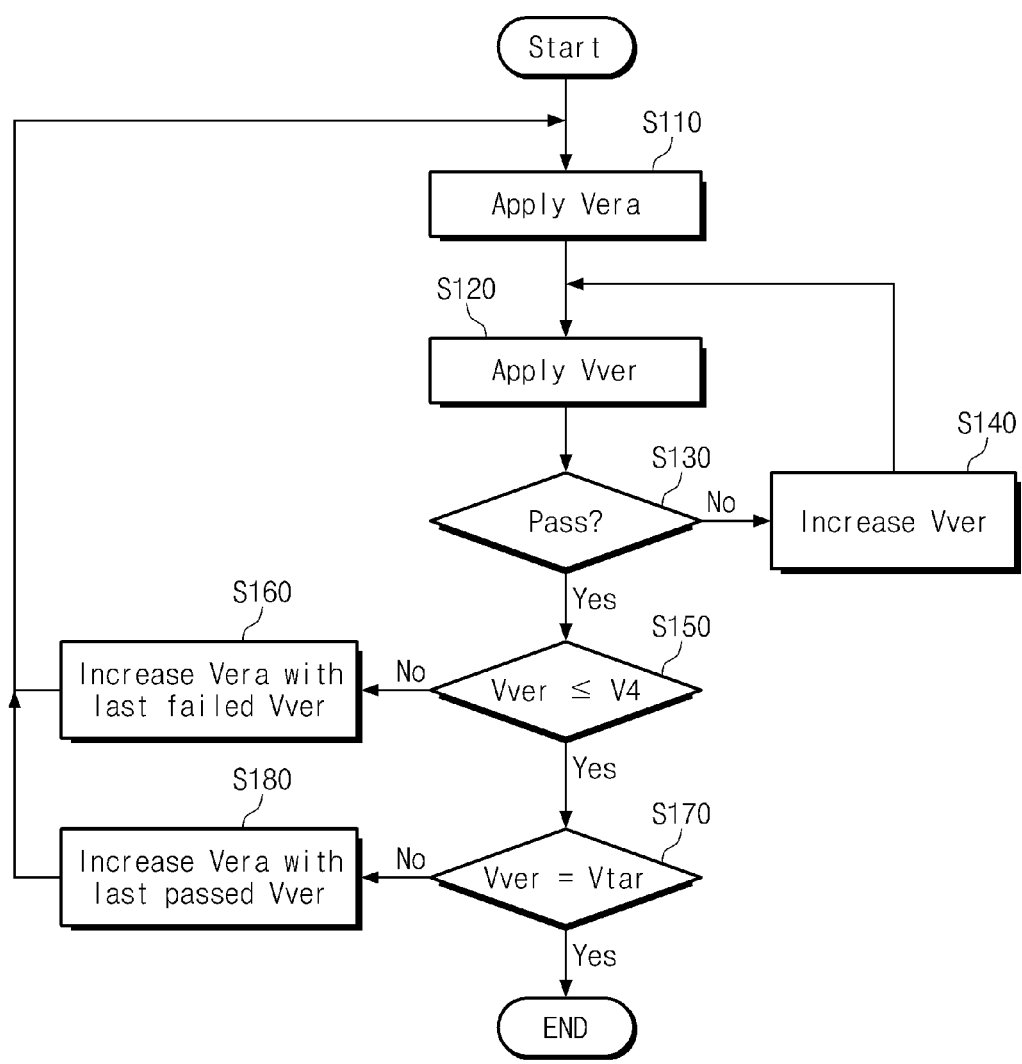
FIG. 4 is a flowchart summarizing a voltage control operation for the nonvolatile memory device of FIG. 2.

FIG. 4 is a flowchart illustrating a voltage control operation for the nonvolatile memory device 200 of FIG. 2. FIGS. 5 through 8 are diagrams illustrating various changes in the threshold voltages of the memory cells (MC) in response to the voltage control operation of FIG. 4.

Figure 5:
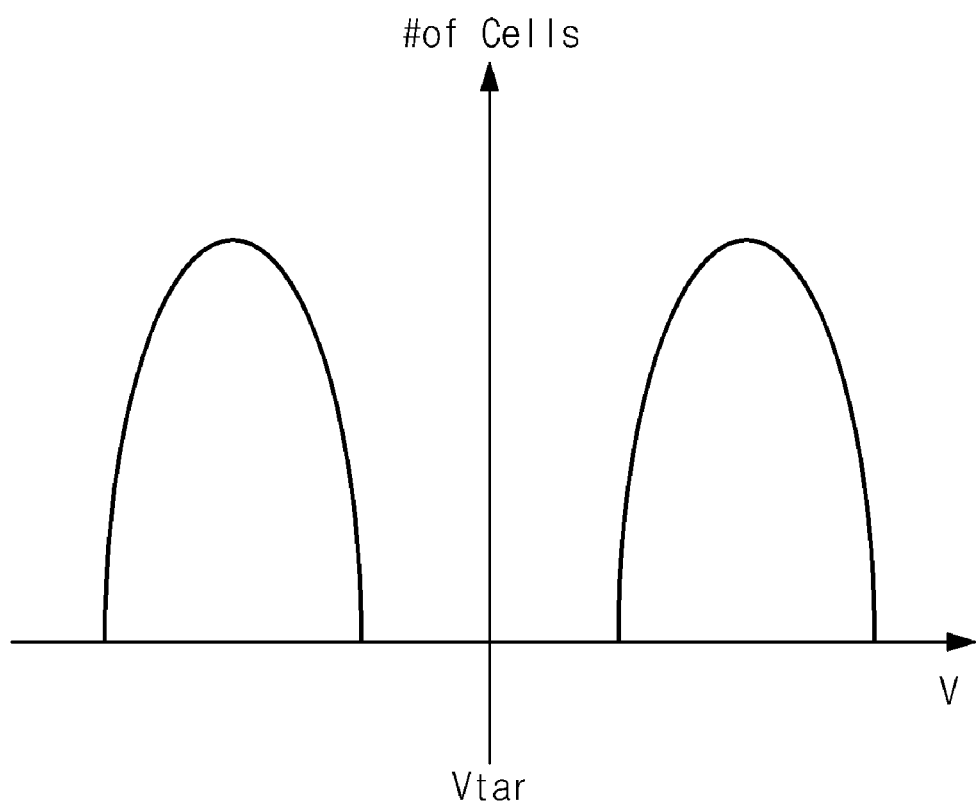
FIGS. 5 through 8 are diagrams illustrating various changes in the threshold voltages of memory cells in response to the voltage control operation of FIG. 4.

Referring collectively to FIGS. 2, 4 and 5, if the memory cells (MC) are single level (binary) memory cells capable of being programmed into one of two logic states, the memory cells (MC) will the distribution of threshold voltages shown in FIG. 5. When an erase operation is performed on the memory cells (MC), the erase voltage (Vera) is applied to a bulk region of the memory cell array 210 (S110). Hereinafter, the erase voltage (Vera) first applied at the beginning of an erase operation will be referred to as an erase beginning voltage. The erase beginning voltage has a predetermined level that varies with the type of memory cells being used. Thus, when the erase operation begins, the erase voltage (Vera) having the erase beginning voltage level is applied to the bulk region of the memory cell array 210.

Figure 6:
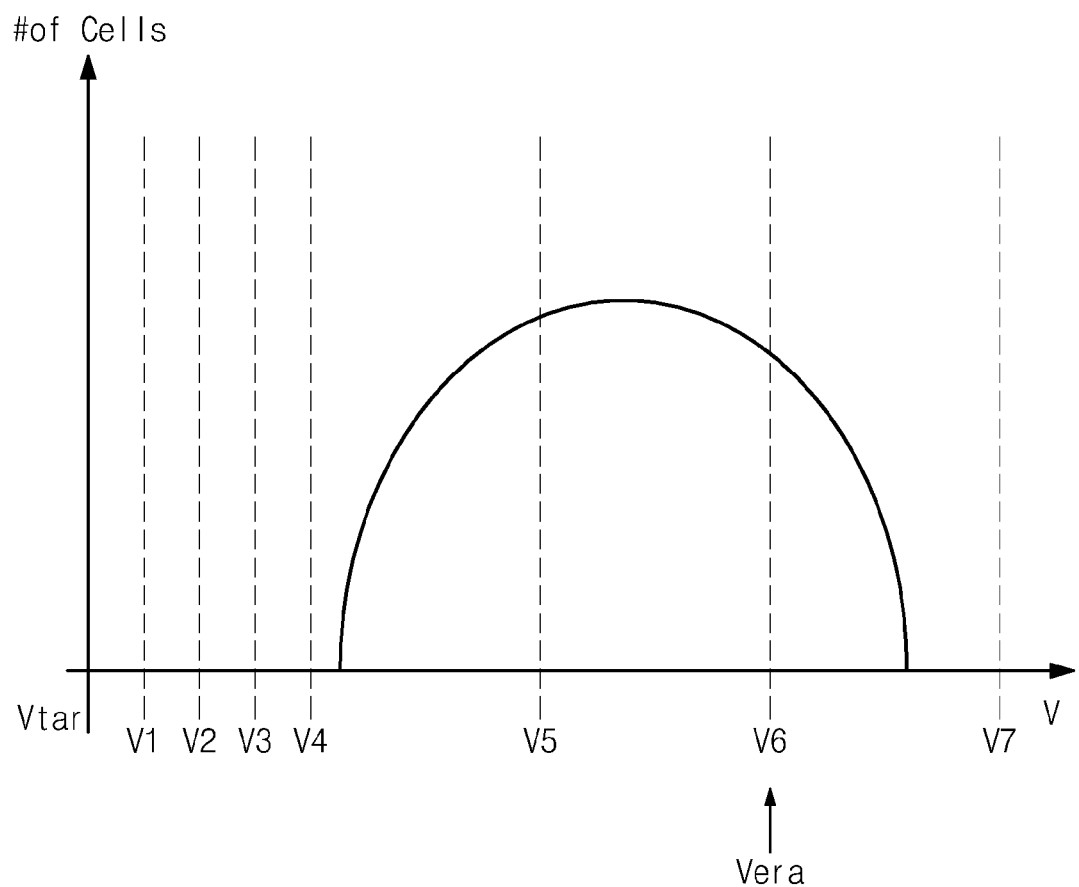

When the erase beginning voltage is applied, the threshold voltages of the memory cells (MC) are reduced. A distribution of threshold voltages for the memory cells (MC) receiving the erase beginning voltage is shown in FIG. 6. As an illustration, a variable voltage range (Vtar-V7) for the verification voltage (Vver) is established such that a distribution of threshold voltages for the memory cells (MC) receiving the erase beginning voltage is distributed within the variable range (Vtar-V7) of the verification voltage (Vver). In certain embodiments of the invention, the target voltage (Vtar) is a ground voltage (Vss, 0V) and the maximum threshold voltage (V7) is 3.5V.

Referring to FIGS. 2 and 6, the control logic 260 verifies the threshold voltage of the memory cells (MC) while gradually increasing the level of the verification voltage (Vver) from the target voltage (Vtar). If memory cells having threshold voltages higher than the verification voltage (Vver) exist, the memory cells are determined to be erase-fail. The control logic 260 then performs a verification operation while increasing the verification voltage (Vver) until the memory cells (MC) are verification-passed.

Returning to the flowchart of FIG. 4, the memory cells (MC) are verified using a current verification voltage (Vver) having the target voltage (Vtar) (S120). Then, since memory cells having threshold voltages higher than the verification voltage exist, the memory cells are determined to be erase-fail (S130=no). Accordingly, voltage (Vver) is increased by the first voltage increment ($\Delta V1$) (S140). This loop (S120, S130, and S140) continues until the memory cells (MC) are verification-passed.

The verification voltage (Vver) is increased by the first voltage increment ($\Delta V1$) unit until the verification voltage (Vver) reaches the first limit voltage (V4). When the verification voltage (Vver) reaches the first limit voltage (V4), the verification voltage (Vver) is then increased by the second voltage increment ($\Delta V2$).

As shown in FIG. 6, threshold voltages of the memory cells (MC) are less than the maximum threshold voltage (V7). That is, when the verification voltage (Vver) reaches the maximum threshold voltage (V7), the memory cells (MC) will be determined be verification-passed (S130).

Once the memory cells (MC) will be determined be verification-passed (S130=yes), it is next determined whether or not the level of the verification voltage (Vver) is less than the first limit voltage (V4). As shown in FIG. 6, if it is determined that the level of the verification voltage (Vver)—when the memory cells (MC) are determined to be verification-passed—is greater than the first limit voltage (V7) (S150=no), then the erase voltage (Vera) is increased (S160).

Figure 7:
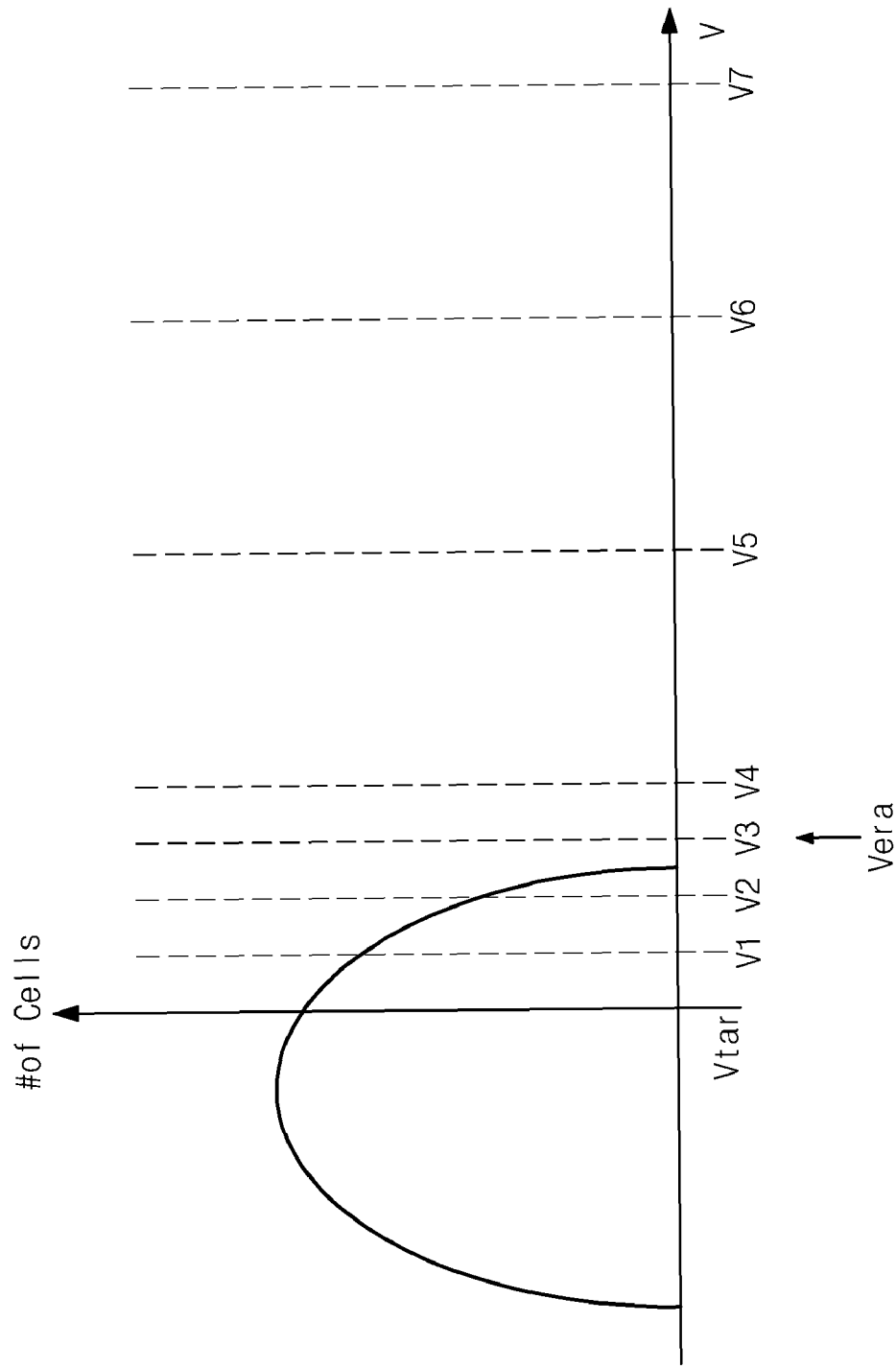

That is, the erase voltage (Vera) is increased to a second limit voltage (V6) between the first limit voltage (V4) and the maximum threshold voltage (V7). In one embodiment of the invention, the second limit voltage is the voltage at which the memory cells (MC) were last determined to be erase-fail. In this manner, the erase voltage (Vera) is adjusted to a voltage lower than the voltage level when the memory cells (MC) were determined to be verification-passed. Following adjustment of the erase voltage to the second limit voltage (V6), the control method returns to step (S110) having established a new erase voltage, and again begins control of the erase voltage (Vera). When the new erase voltage (Vera) is applied to the memory cells, the resulting threshold voltages for the memory cells (MC) are reduced, as shown in FIG. 7.

The threshold voltages for the memory cells (MC) are now reduced to a level less than the first limit voltage (V4) in response to the new erase voltage (Vera). This new level is lower than the level of the verification voltage (Vver) when the memory cells (MC) are verification-passed. Again using method steps (S120) through (S140), a verification operation is performed on the memory cells (MC). As shown in FIG. 7, as the verification voltage (Vver) increases from the target voltage (Vtar) to a first lesser limit voltage (V3) below the first limit voltage (V4), the memory cells (MC) are determined to be verification-passed.

It is now again determined whether or not the level of the verification voltage (Vver)—when the memory cells (MC) are determined to be verification-passed—is less than the first limit voltage (V4). Since the memory cells (MC) are not verification-passed when the level of the verification voltage (Vver) reaches the first lesser limit voltage (V3), the verification voltage (Vver) is indeed less than the first limit voltage (V4) (S150=yes). Thus, the method step (S170) is performed.

Now, it is determined whether or not the verification voltage (Vver)—when the memory cells (MC) are verification-passed—is equal to the target voltage (Vtar). If it is determined that the level of the verification voltage (Vver)—when the memory cells (MC) are verification-passed (i.e., the first less limit voltage (V3))—is nonetheless greater than the target voltage (Vtar) (S170=no), then method step (S180) is performed.

The erase voltage (Vera) is then increased to the level of the verification voltage (Vver) at which the memory cells (MC) were last verification-passed. The control method then returns to step (S110) having established a new erase voltage. Once the new erase voltage (Vera) is applied, the threshold voltages for the memory cells (MC) will be further reduced as shown in FIG. 8.

Figure 8:
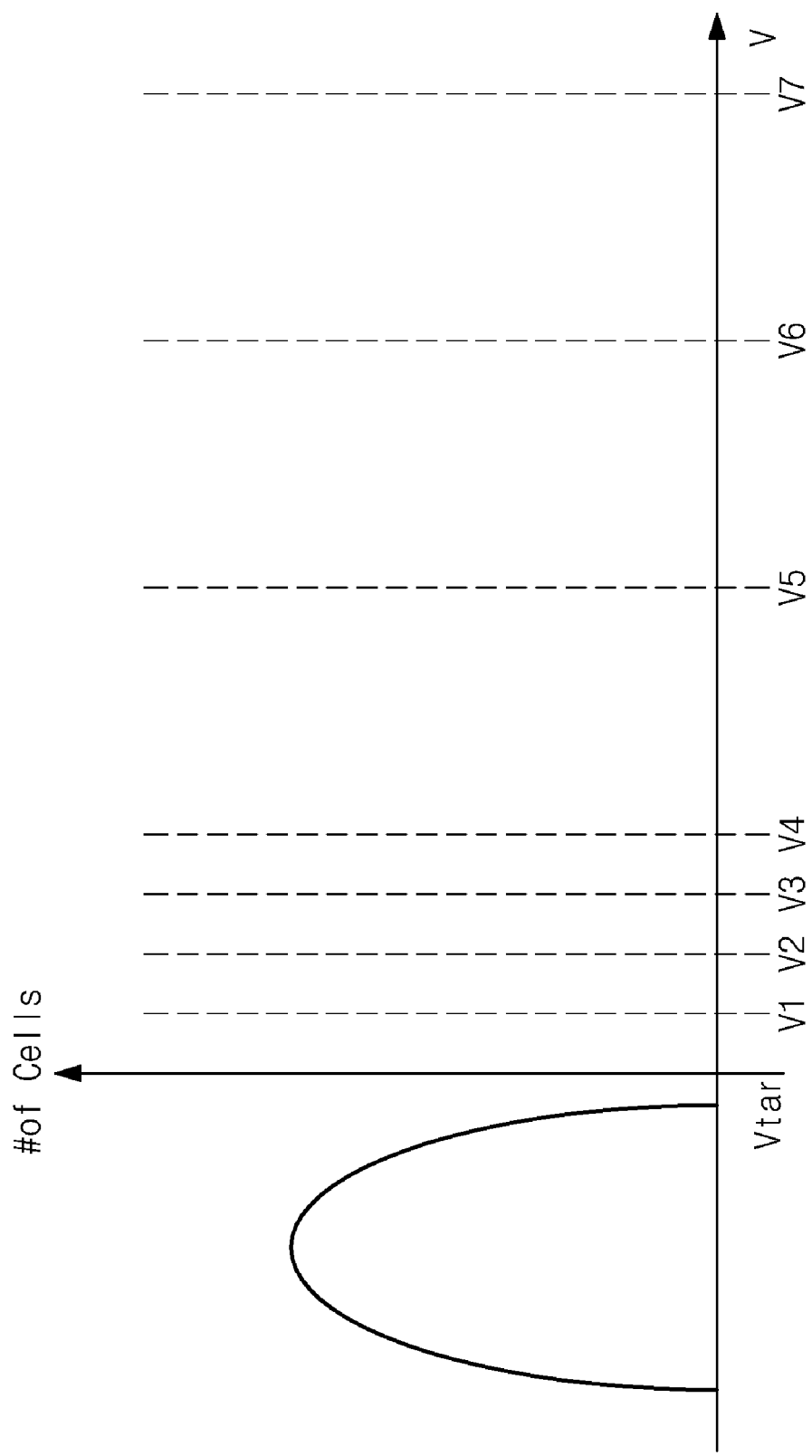

As shown in FIG. 8, the threshold voltages of the memory cells (MC) is now less than the target voltage (Vtar). Therefore, the memory cells (MC) are erase-passed and an erase operation is completed.

As described above, the nonvolatile memory device 200 according to an embodiment of the invention increases the erase voltage (Vera) by a relatively small first voltage increment ($\Delta V1$), if the threshold voltages for the memory cells (MC) is less than a defined first limit voltage (V4). That is, the memory cells (MC) will be erased using an erase voltage being incremented at relatively small increments, as compared with conventional erase methods that steadily increase the erase voltage (Vera) through control loop cycles. Accordingly, a high voltage stress applied to the nonvolatile memory device 200 during an erase operation performed according to an embodiment of the invention is reduced.

Also, the nonvolatile memory device 200 according to an embodiment of the invention performs an erase operation by increasing the erase voltage (Vera) using a relatively larger voltage increment ($\Delta V2$), if the threshold voltages for the memory cells (MC) are greater than the first limit voltage (V4), and then performs an erase operation by increasing the erase voltage (Vera) by the relatively small voltage increment ($\Delta V1$). Since only erase operation cycles are performed using either a first or second voltage increment ($\Delta V1$) and ($\Delta V2$), the overall number of erase voltage (Vera) applications during the erase operation may be reduced, as compared with conventional erase operations that only steadily increase the erase voltage (Vera). Therefore, an erase speed of the nonvolatile memory device 200 is improved and the stress due to the high voltage is reduced In the embodiment described above, the memory cells (MC) store single bit data having an erase state and a program state. However, embodiments of the invention are not limited to only single bit memory cells. Rather, certain embodiments of the invention contemplate the use of multi level memory cells storing a plurality of data bits per memory cell. Those skilled in the art will recognize that an analogous erase method in view of the foregoing may be implemented. That is, it will be understood that the present invention may be applied to all the memory devices to which a voltage or a current is applied to perform the erase operation regardless of how many bits one memory cell stores.

Referring to step (S130) in the foregoing example, when setting the level of the verification voltage (Vver) to the target voltage (Vtar), and then performing the verification operation, if the memory cells (MC) are verification-passed, the method may conclude without the need of performing the iterative loop steps (S140) through (S180).

In the embodiment described above, the verification voltage (Vver) is four first voltage increments ($\Delta V1$) above the target voltage (Vtar) when it reaches the first limit voltage (V4). However, the relationship between the first limit voltage ($\Delta V1$) and the verification voltage (Vver) may be otherwise defined.

Figure 9:
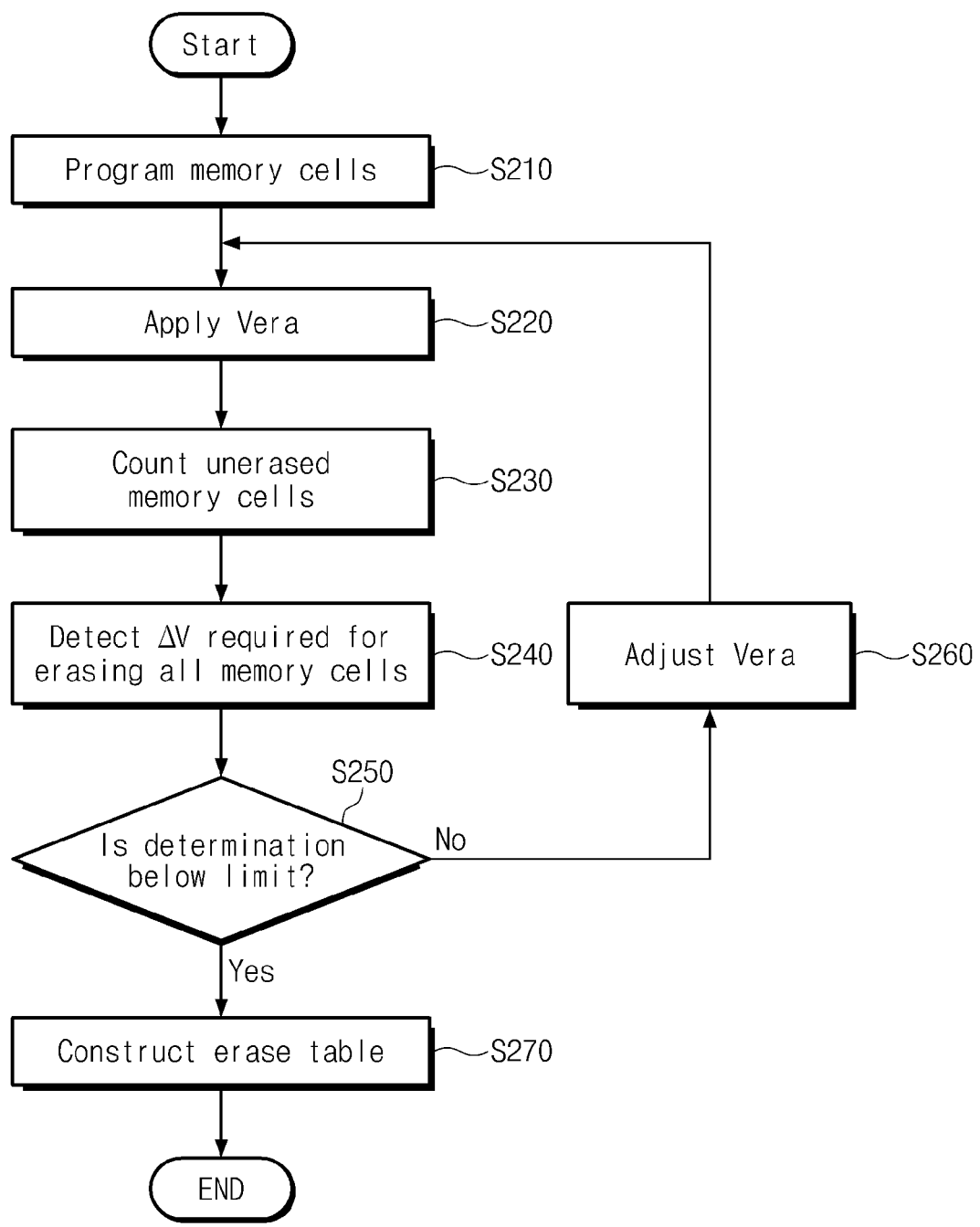
FIG. 9 is a flowchart summarizing an erase operation according to embodiment of the invention.

FIG. 9 is a flowchart summarizing an erase method according to another embodiment of the invention. Referring to FIG. 9, memory cells are first programmed (S210). Then, an erase voltage (Vera) is applied (S220). After that, a number of unerased memory cells is counted (S230), and an increment for the erase voltage (Vera) required to erase all of the memory cells is determined (S240). Through steps (S210) and (S240), information regarding the necessary increment of the erase voltage (Vera) corresponding to the number of the unerased memory cells is obtained.

Then, it is determined whether counted number of unerased memory cells and/or the corresponding erase voltage increment is below defined limit(s) (S250). Method steps (S210) through (S250) are repeated until the counted number of unerased memory cell and/or the corresponding erase voltage increment is below the defined limit(s). As necessary, the level of the erase voltage (Vera) is adjusted according to the corresponding erase voltage increment (S260). Thus, steps (S210) through (S250) may be performed to control the level of the erase voltage (Vera) applied to programmed memory cells.

Once the defined limit(s) are no longer exceeded, (i.e., a predetermined number of unerased memory cells is obtained), a table identifying the unerased memory cells, as well as the current increment to the erase voltage (Vera) is constructed for reference by the memory system (S270). Once this table has been obtained (or updated), further erase operations may be performed in view of the table data. As an illustration, the erase voltage (Vera) having a predetermined level is applied to the memory cells (MC). The number of memory cells, which are not erased even when the erase voltage (Vera) is applied, is counted. If the number of unerased memory cells is counted, an increment of the erase voltage (Vera) corresponding to the number of the unerased memory cells may be determined from the table. The erase voltage (Vera) is increased by the increment obtained from the table and if performing the erase operation using the increased erase voltage (Vera), memory cells are erase-passed.

In a case where the erase characteristics for memory cells vary with deterioration of the memory cells over time—that is, in a case where an erase fail occurs even though performing the erase operation using current table data—, the erase operation summarized in FIG. 9 may be performed using an updated table.

As described above, the nonvolatile memory device according to the embodiment of the invention performs the verification operation until memory cells are verification-passed while controlling the verification voltage, controls a level of an erase (bias) voltage to be applied to the memory cells according to a level of the verification voltage of when the memory cells are verification-passed and applies the controlled erase (bias) voltage to the memory cells. Accordingly, the number of erase voltage cycles applied during an erase operation may be reduced, and since the erase voltage may also be reduced, the high voltage stress otherwise applied to the nonvolatile memory cells may be reduced, and erase speed may be improved.

Figure 10:
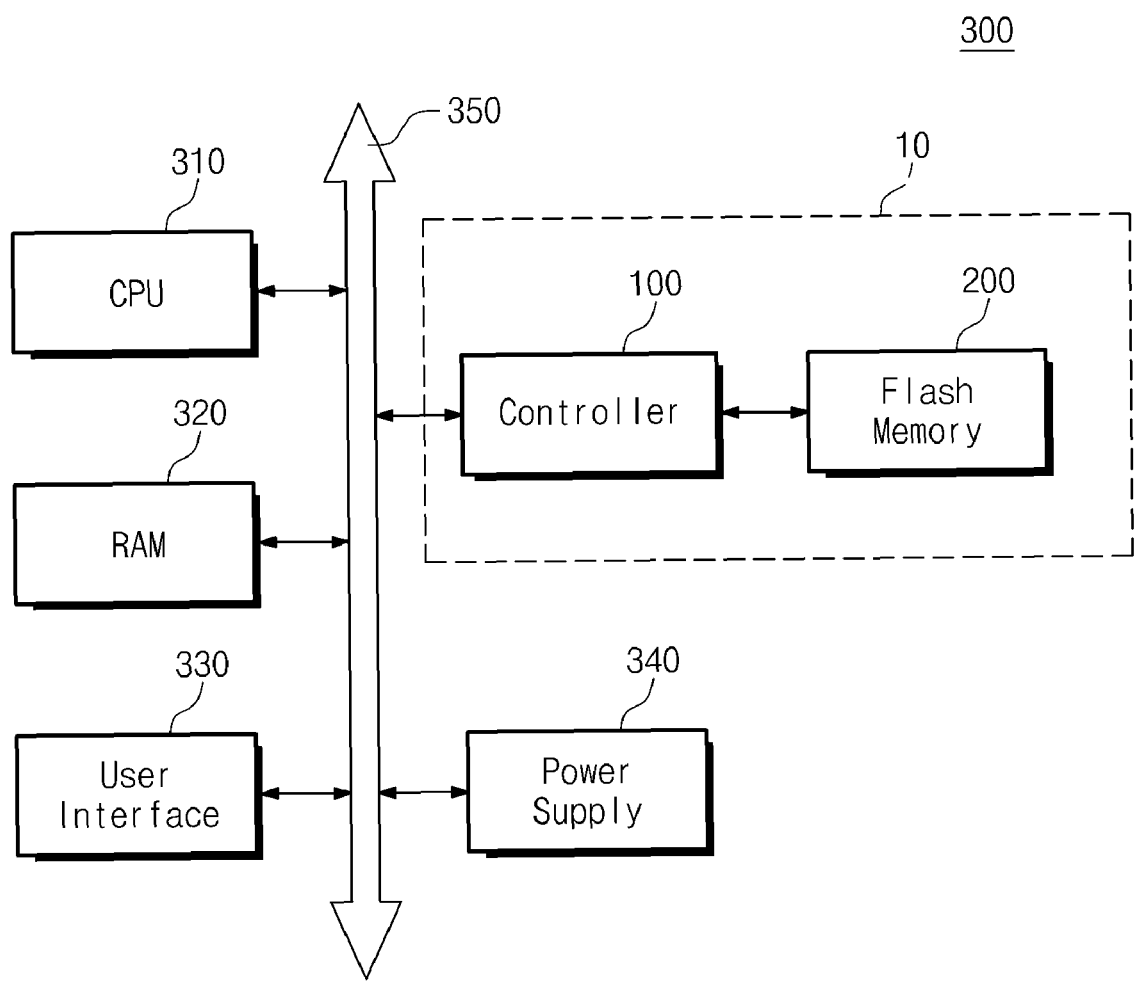
FIG. 10 is a general block diagram of a computational system including the memory system of FIG. 1.

FIG. 10 is a general block diagram of a computational system including the memory system of FIG. 1. Referring to FIG. 10, a computational system 300 includes a central processing unit 310, a random access memory (RAM) 320, a user interface 330, a power supply 340 and a memory system 10.

The memory system 10 is connected to the central processing unit 310, the random access memory (RAM) 320, the user interface 330 and the power supply 340 through a system bus 350. Data provided through the user interface 330 or treated by the central processing unit 310 is stored in the memory system 10. The memory system 10 includes a controller 100 and a flash memory device 200.

When the memory system 10 is installed as a solid state drive (SSD), a booting speed of the computing system 300 may become greatly fast. The memory system 300 according to the present invention may further include an application chip set and a camera image processor.

The above-disclosed subject matter is to be considered illustrative, and not restrictive, and the appended claims are intended to cover all such modifications, enhancements, and other embodiments, which fall within the scope of the invention. Thus, to the maximum extent allowed by law, the scope of the present invention is to be determined by the broadest permissible interpretation of the following claims and their equivalents, and shall not be restricted or limited by the foregoing detailed description.

While example embodiments have been particularly shown and described with reference to example embodiments thereof, it will be understood by one of ordinary skill in the art that various changes in form and details may be made therein without departing from the scope of the following claims.

What is claimed is:

1. A method of operating a nonvolatile memory device comprising:
performing a verification operation on memory cells while controlling a verification voltage until the memory cells are verification-passed;
controlling a level of a bias voltage to be applied to the memory cells according to a level of the verification voltage when the memory cells are verification-passed; and
applying the bias voltage to the memory cells.

2. The method of claim 1, wherein the bias voltage is an erase voltage and the verification voltage is an erase verification voltage.

3. The method of claim 1, wherein if the level of the verification voltage when the memory cells are verification-passed is higher than a first limit voltage, the level of the bias voltage is adjusted to a level lower than the level of the verification voltage of when the memory cells are verification-passed.

4. The method of claim 1, wherein if the level of the verification voltage when the memory cells are verification-passed is lower than a first limit voltage, the level of the bias voltage is adjusted to the level of the verification voltage when the memory cells are verification-passed.

5. The method of claim 1, further comprising:
setting the bias voltage to a predetermined level before performing the verification operation and applying the bias voltage to the memory cells.

6. A method of erasing programmed memory cells in a nonvolatile memory device, the method comprising:
applying an erase voltage having an erase beginning voltage to the memory cells;
comparing threshold voltages for the memory cells to a verification voltage;
determining whether the memory cells are verification-passed in relation to the verification voltage;
upon determining that the memory cells are verification-passed, determining whether the verification voltage is less than a defined first limit voltage;
upon determining that the verification voltage is not less than a defined first limit voltage, adjusting the erase voltage to be equal to a voltage at which the memory cells were last determined to be erase-fail; and thereafter,
applying the adjusted erase voltage to the memory cells.

7. The method of claim 6, further comprising:
after applying the adjusted erase voltage to the memory cells, again comparing the threshold voltages for the memory cells to the verification voltage, determining whether the memory cells are verification-passed in relation to the verification voltage, and upon determining that the memory cells are verification-passed, determining whether the verification voltage is less than a defined first limit voltage;
upon determining that the verification voltage is less than a defined first limit voltage, determining whether the verification voltage is equal to a target voltage.

8. The method of claim 6, further comprising:
upon determining the verification voltage is not equal to the target voltage, adjusting the erase voltage to a level of the verification voltage at which the memory cells were last verification-passed; and
applying the adjusted erase voltage to the memory cells.

9. A method of operating a nonvolatile memory device applying an erase voltage to memory cells during an erase operation, the method comprising:
applying the erase voltage to the memory cells;
counting a number of unerased memory cells following application of the erase voltage;
determining a current erase voltage adjustment increment corresponding to the number of unerased memory cells;
comparing at least one of the number of unerased memory cells and the erase voltage adjustment increment to a limit; and
upon obtaining a number of unerased memory cells or an erase voltage adjustment increment below the limit, constructing an erase table identifying the unerased memory cells and a corresponding erase voltage adjustment increment.

10. The method of claim 9, further comprising:
before obtaining the number of unerased memory cells or the erase voltage adjustment increment below the limit, adjusting the erase voltage by the current erase voltage adjustment increment, and then reapplying the erase voltage to the memory cells.

* * * * *